(12) United States Patent
Lin (10) Patent No.: US 12,272,483 B2
(45) Date of Patent: Apr. 8, 2025

(54) ELECTRONIC MODULE

(71) Applicant: CYNTEC CO., LTD., Hsinchu (TW)

(72) Inventor: Yi-Cheng Lin, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 375 days.

(21) Appl. No.: 17/731,267

(22) Filed: Apr. 28, 2022

(65) Prior Publication Data

US 2022/0353994 A1     Nov. 3, 2022

Related U.S. Application Data

(60) Provisional application No. 63/180,659, filed on Apr. 28, 2021.

(51) Int. Cl.
| | | |
|---|---|---|
| *H05K 1/18* | (2006.01) | |
| *H01F 27/02* | (2006.01) | |
| *H01F 27/245* | (2006.01) | |
| *H01F 27/255* | (2006.01) | |
| *H01F 27/28* | (2006.01) | |
| *H01F 27/29* | (2006.01) | |
| *H01F 27/30* | (2006.01) | |
| *H01F 27/32* | (2006.01) | |
| *H01F 41/02* | (2006.01) | |
| *H01F 41/04* | (2006.01) | |

(Continued)

(52) U.S. Cl.
CPC ......... *H01F 27/255* (2013.01); *H01F 27/022* (2013.01); *H01F 27/245* (2013.01); *H01F 27/2804* (2013.01); *H01F 27/29* (2013.01); *H01F 27/306* (2013.01); *H01F 27/323* (2013.01); *H01F 41/0233* (2013.01); *H01F 41/04* (2013.01); *H01F 41/041* (2013.01); *H01F 41/122* (2013.01); *H05K 1/18* (2013.01); *H05K 3/284* (2013.01); *H01F 2027/2809* (2013.01); *H05K 2201/10037* (2013.01)

(58) Field of Classification Search
CPC ............... H01F 17/0006; H01F 17/04; H01F 2003/106; H01F 2027/2809; H01F 27/022; H01F 27/245; H01F 27/255; H01F 27/263; H01F 27/2804; H01F 27/29; H01F 27/306; H01F 27/323; H01F 3/08; H01F 3/10; H01F 41/0233; H01F 41/04; H01F 41/041; H01F 41/122; H05K 1/18; H05K 2201/10037; H05K 3/284; H05K 3/28; Y02E 60/10; H01M 10/425; H01M 2200/101; H01M 2200/103; H01M 2200/106; H01M 50/15; H01M 50/50; H01M 50/574; H01M 50/581; H01M 50/591
USPC .............................................. 174/250; 429/7
See application file for complete search history.

(56) References Cited

U.S. PATENT DOCUMENTS

| | | | |
|---|---|---|---|
| 2011/0183160 A1* | 7/2011 | Baek ................... | H01M 10/425 429/7 |
| 2017/0069901 A1* | 3/2017 | Haraguchi ........ | H01M 10/0422 |

FOREIGN PATENT DOCUMENTS

JP            2011181362 A    *  9/2011    ............. H01H 37/76

* cited by examiner

*Primary Examiner* — Timothy J Thompson
*Assistant Examiner* — Guillermo J Egoavil
(74) *Attorney, Agent, or Firm* — Min-Lee Teng (57) ABSTRACT

An electronic module comprising electrical components on a circuit board and a molding body disposed on the circuit board to encapsulate the electrical components, wherein a recess is formed in the molding body for exposing an electrode of the electronic module for connecting with an external component.

20 Claims, 9 Drawing Sheets

(51) Int. Cl.
*H01F 41/12* (2006.01)
*H05K 3/28* (2006.01)

ELECTRONIC MODULE

CROSS-REFERENCE TO RELATED APPLICATION

The present application claims the benefit of U.S. Provisional Application Ser. No. 63/180,659 filed on Apr. 28, 2021, which is hereby incorporated by reference herein and made a part of the specification.

BACKGROUND OF THE INVENTION

I. Field of the Invention

The invention relates to an electrode structure, and in particular, to an electrode structure for connecting with a battery.

II. Description of the Related Art

A conventional circuit board mounted on a battery has a very thick electrode on the circuit board to reduce the influence of residual heat during spot-welding. However, the very thick electrode takes a larger PCB space and also can cause the distance between the electrode and the electrical component larger.

Furthermore, a conventional circuit board mounted on a battery has no protection for the electrical components disposed on the circuit board.

Accordingly, there is a demand for a better solution to solve these problems.

SUMMARY OF THE INVENTION

One objective is to provide an electronic module for reducing the influence of residual heat during spot-welding One objective is to provide an electronic module for reducing the distance between the electrode and the electrical components on the circuit.

One objective is to provide an electronic module for reducing the size of the circuit board and the total height of the electronic module.

In one embodiment, an electronic module is disclosed, wherein the electronic module, comprising: a circuit board; a plurality of electrical components, disposed on a first surface of the circuit board and electrically connected to the circuit board; a molding body, disposed on the first surface of the circuit board to encapsulate the plurality of electrical components, wherein a first recess is formed in the molding body; and a first electrode, electrically coupled to the circuit board, wherein the first electrode is exposed through the first recess for electrically connecting with an external component.

In one embodiment, the external component is a battery, wherein at least one portion of an electrode of the battery is disposed in the recess and electrically connected to the first electrode of the module with the first recess being located between the circuit board and the battery.

In one embodiment, the external component is a battery, wherein at least one portion of an electrode of the battery is disposed in the recess and electrically connected to the first electrode of the module.

In one embodiment, a second recess is formed in the molding body, wherein the electronic module further comprises a second electrode electrically coupled to the circuit board, wherein the second electrode is exposed through the second recess for electrically connecting with an external component.

In one embodiment, the external component is a battery, wherein at least one portion of a positive electrode of the battery is disposed inside the first recess and electrically connected to the first electrode of the module, and at least one portion of a negative electrode of the battery is disposed inside the second recess and electrically connected to the second electrode of the module.

In one embodiment, the external component is a PCB.

In one embodiment, the metal structure has a U shape.

In one embodiment, the metal structure has an L shape.

In one embodiment, the metal structure comprises copper.

In one embodiment, the metal structure comprises a copper layer and a tin layer overlaid on the copper layer.

In one embodiment, the metal structure and a bottom surface of the circuit board form a space therebetween, wherein at least one electrical component is disposed in said space and a bottom surface of the metal structure forms an electrode for electrically connecting with an external component.

In one embodiment, the metal structure and a top surface of the circuit board form a space therebetween, wherein at least one electrical component is disposed in said space and a top surface of the metal structure forms an electrode for electrically connecting with an external component.

In one embodiment, the metal structure is soldered to the circuit board.

In one embodiment, the at least one electrical component comprises a passive device.

In one embodiment, the at least one electrical component comprises at least one of the following: a resistor, a capacitor, and an inductor.

In one embodiment, the at least one electrical component comprises an active device.

In one embodiment, the at least one electrical component comprises an IC.

In one embodiment, the at least one electrical component comprises an active device and a passive device.

In one embodiment, the electrode structure further comprises a second metal structure disposed on and electrically connected to the circuit board, wherein the second metal structure and a second surface of the circuit board form a second space therebetween, wherein at least one second electrical component is disposed in said second space and an outer surface of the second metal structure forms a second electrode for electrically connecting with an external component.

In one embodiment, the external component is a battery and the first electrode and the second electrode are electrically connected to a positive electrode and a negative electrode of the battery, respectively.

In one embodiment, the first electrode has a first surface-mounted pad.

In one embodiment, the first electrode has a first surface-mounted pad and the second electrode has a second surface-mounted pad.

In one embodiment, lateral surfaces of the first metal structure comprise a closed metal path.

In one embodiment, lateral surfaces of the second metal structure comprise a closed metal path.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for simplicity and clarity and does not in itself dictate a relationship between the various embodiments and/or configurations discussed.

Figure 1A:
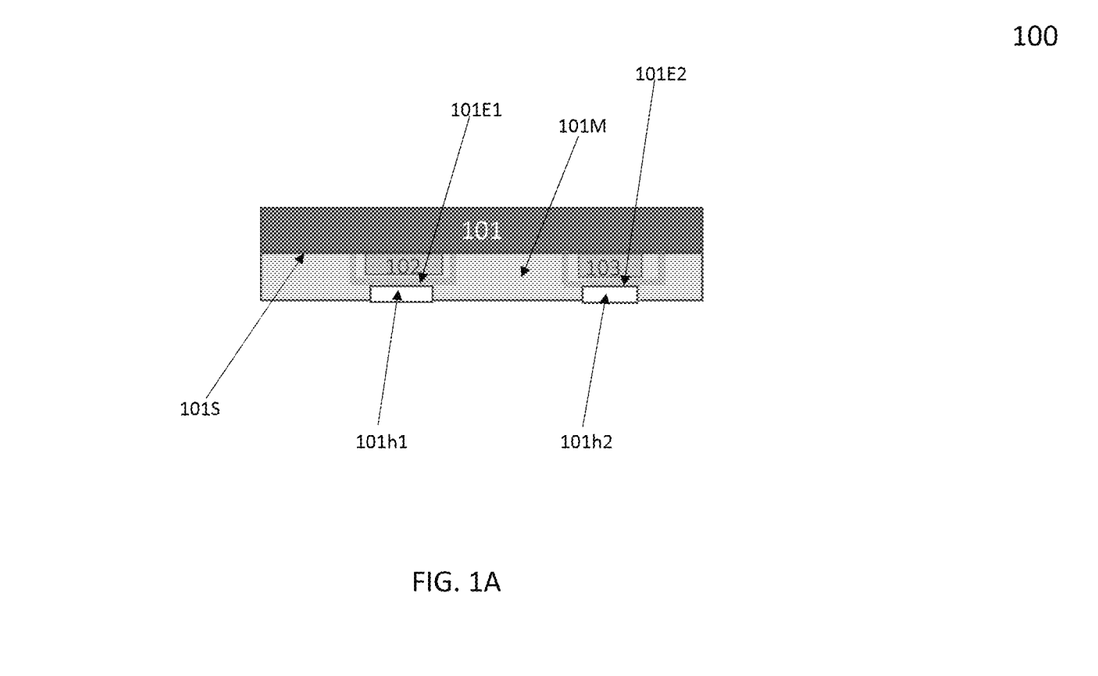
FIG. 1A illustrates a side view of an electronic module according to one embodiment of the present invention.

FIG. 1A illustrates a side view of an electronic module 100, wherein the electronic module 100 comprises: a circuit board 101; a plurality of electrical components 102, 103, disposed on a first surface 101S of the circuit board 101 and electrically connected to the circuit board 101; a molding body 101M, disposed on the first surface 101S of the circuit board 101 to encapsulate the plurality of electrical components 102, 103, wherein a first recess 101h1 is formed in the molding body 101M; a first electrode 101E1, electrically coupled to the circuit board 101, wherein the first electrode 101E1 is exposed through the first recess 101h1 for electrically connecting with an external component.

Figure 1B:
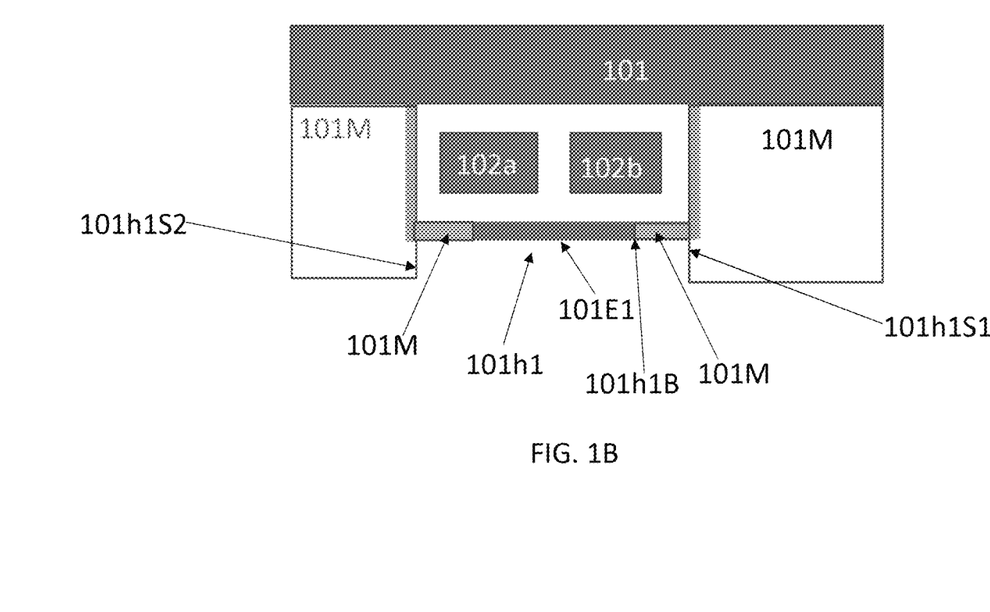
FIG. 1B illustrates a side view of the first recess of the electronic module in FIG. 1A according to one embodiment of the present invention.

In one embodiment, as shown in FIG. 1B, the first recess 101h1 is formed by a first sidewall 101h1S1, a second sidewall 101h1S2, and the bottom surface 101h1B that is formed by a portion of the molding body 101M and the first electrode 101E1.

Figure 1C:
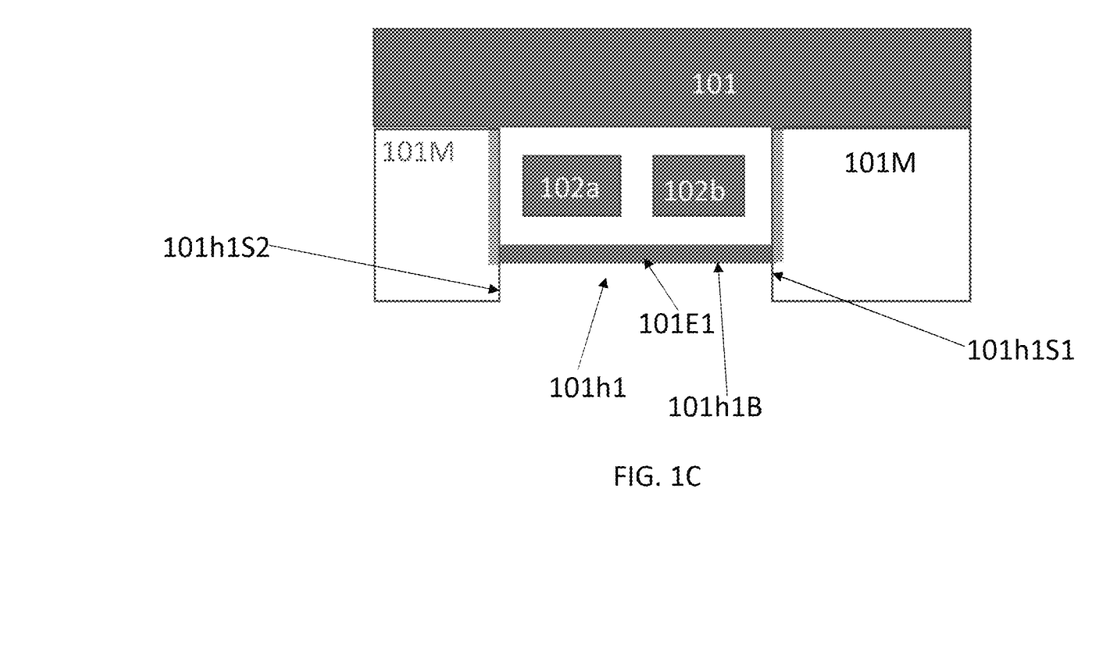
FIG. 1C illustrates a side view of the first recess of the electronic module in FIG. 1A according to one embodiment of the present invention.

In one embodiment, as shown in FIG. 1C, the first recess 101h1 is formed by a first sidewall 101h1S1, a second sidewall 101h1S2, and the bottom surface 101h1B formed by the first electrode 101E1.

In one embodiment, a second recess 101h2 is formed in the molding body 101M, wherein the electronic module 100 comprises a second electrode 101E2 electrically coupled to the circuit board 101, wherein the second electrode 101E2 is exposed through the second recess 101h2 for electrically connecting with an external component.

Figure 1D:
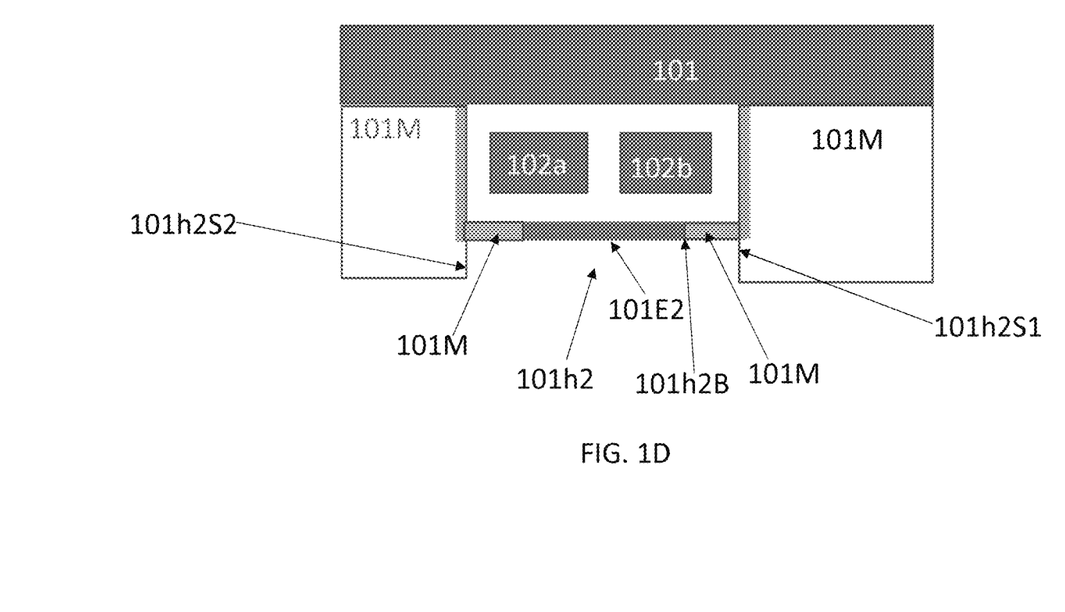
FIG. 1D illustrates a side view of the second recess of the electronic module in FIG. 1A according to one embodiment of the present invention.

In one embodiment, as shown in FIG. 1D, the second recess 101h2 is formed by a first sidewall 101h2S1, a second sidewall 101h2S2, and the bottom surface 101h2B that is formed by a portion of the molding body 101M and the first electrode 101E2.

Figure 1E:
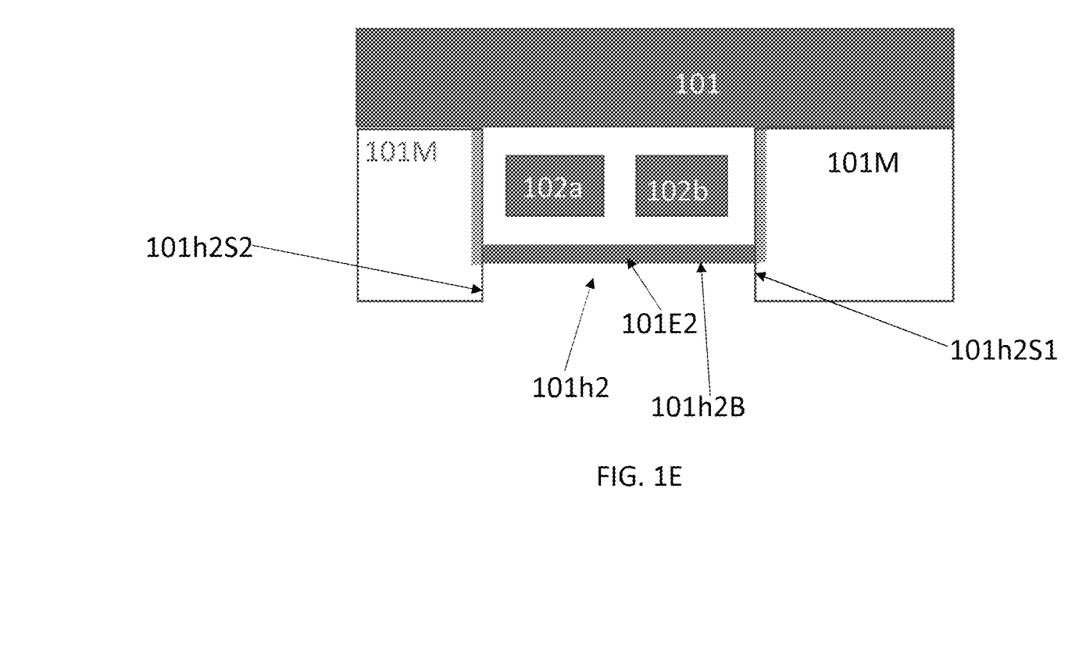
FIG. 1E illustrates a side view of the second recess of the electronic module in FIG. 1A according to one embodiment of the present invention.

In one embodiment, as shown in FIG. 1E, the second recess 101h2 is formed by a first sidewall 101h2S1, a second sidewall 101h2S2, and the bottom surface 101h2B formed by the first electrode 101E2.

Figure 2A:
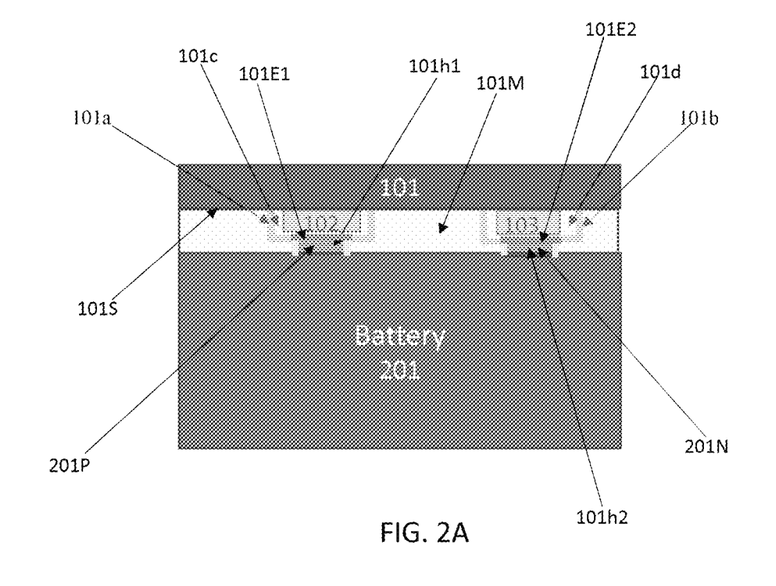
FIG. 2A illustrates a side view of a packaging structure according to one embodiment of the present invention.

In one embodiment, as shown in FIG. 2A a first metal structure 101a is disposed on and electrically connected to the circuit board 101, wherein the first metal structure 101a and the first surface 101S of the circuit board 101 form a first space 101c therebetween, wherein at least one first electrical component 102 is disposed in said first space 101c and an outer surface of the first metal structure 101a forms a first electrode for electrically connecting with an external component.

In one embodiment, as shown in FIG. 2A, the external component is a battery 201, wherein at least one portion of an electrode 201P of the battery 201 is disposed in the first recess 101h1 and electrically connected to the first electrode 101E1 of the electronic module 100 with the first recess 101h1 being located between the circuit board 101 and the battery 201.

In one embodiment, as shown in FIG. 2A, at least one portion of a positive electrode 201P of the battery 201 is disposed inside the first recess 101h1 and electrically connected to the first electrode 101E1 of the electronic module 100, and at least one portion of a negative electrode 201N of the battery 201 is disposed inside the second recess 101h2 and electrically connected to the second electrode 101E2 of the electronic module 100.

In one embodiment the external component is a battery 201, wherein the first metal structure 101a is electrically connected to a positive electrode 201P of the battery 201.

In one embodiment the external component is a battery 201, wherein the first metal structure 101a is electrically connected to a negative electrode 201N of the battery 201.

In one embodiment, the first surface of the circuit board 101 is a bottom surface of the circuit board.

Figure 2B:
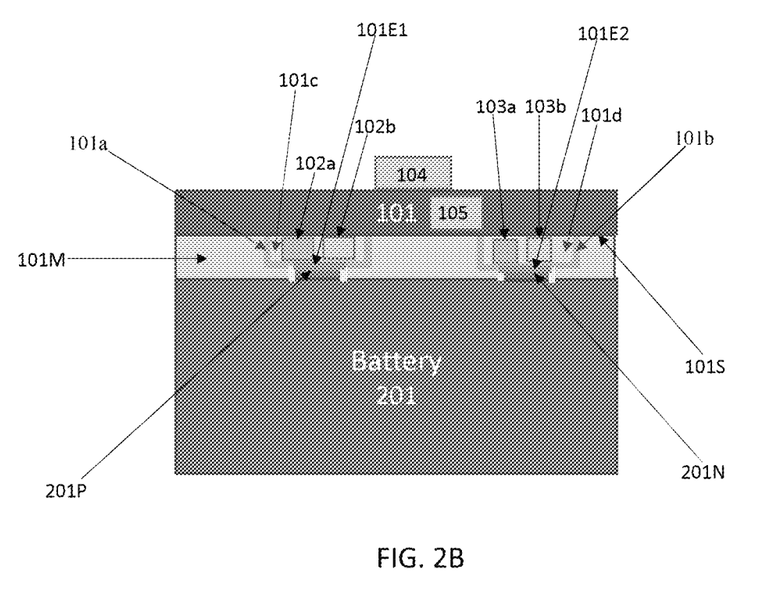
FIG. 2B illustrates a side view of a packaging structure according to one embodiment of the present invention

In one embodiment, as shown in FIG. 2B, at least one electrical component 104 is disposed on the top surface of the circuit board.

In one embodiment, the first surface of the circuit board 101 is a top surface of the circuit board.

In one embodiment, the external component is a PCB.

In one embodiment, the metal structure has a U shape.

In one embodiment, the metal structure has an L shape.

In one embodiment, the first metal structure 101a comprises copper.

In one embodiment, the first metal structure 101a is made of copper.

In one embodiment, the first metal structure 101a comprises a copper layer and a tin layer overlaid on the copper layer.

In one embodiment, the first metal structure 101a comprises copper, nickel, and aluminum.

In one embodiment, the first metal structure 101a comprises a copper layer and a nickel layer overlaid on the copper layer.

In one embodiment, the first metal structure 101a comprises a copper layer, a nickel layer overlaid on the copper layer, and an aluminum layer overlaid on the nickel layer.

In one embodiment, the first metal structure 101a comprises a copper layer, a nickel layer overlaid on the copper layer, an aluminum layer overlaid on the nickel layer, and a gold layer overlaid on the aluminum layer.

In one embodiment, the first metal structure 101a and a bottom surface of the circuit board 101 form a space therebetween, wherein at least one electrical component is disposed in said space, and a bottom surface of the metal structure forms an electrode for electrically connecting with an external component.

In one embodiment, the first metal structure 101a and a top surface of the circuit board 101 form a space therebetween, wherein at least one electrical component is disposed in said space and a top surface of the metal structure forms an electrode for electrically connecting with an external component.

In one embodiment, the first metal structure 101a is soldered to the circuit board.

In one embodiment, the at least one electrical component comprises a passive device.

In one embodiment, the at least one electrical component comprises at least one of the following: a resistor, a capacitor, and an inductor.

In one embodiment, the at least one electrical component comprises an active device.

In one embodiment, the at least one electrical component comprises an IC.

In one embodiment, the at least one electrical component comprises an active device and a passive device.

In one embodiment, as shown in FIG. 2A, the electrode structure further comprises a second metal structure 101b disposed on and electrically connected to the circuit board 101, wherein the second metal structure 101b and a second surface of the circuit board form a second space 101d therebetween, wherein at least one second electrical component 103 is disposed in said second space 101d and an outer surface of the second metal structure 101b forms a second electrode for electrically connecting with the external component.

In one embodiment, as shown in FIG. 2A, the external component is a battery 201 and the first metal structure 101a and the second metal structure 101b are electrically connected to a positive electrode 201P and a negative electrode 201N of the battery 201, respectively.

In one embodiment, as shown in FIG. 2B, at least one electrical component 105 is embedded in the circuit board.

In one embodiment, as shown in FIG. 2B, wherein a plurality of electrical components 102a, 102b are disposed in the first space 101c.

In one embodiment, as shown in FIG. 2B, wherein a plurality of electrical components 103a, 103b are disposed in the second space 101d.

In one embodiment, at least one IC is embedded in the circuit board 101.

In one embodiment, at least one of the following electrical components is disposed on the circuit board: a driver IC, a control IC, a MOSFET, an IGBT, and a Diode.

In one embodiment, at least one active device and at least one passive device are embedded in the circuit board.

Figure 3A:
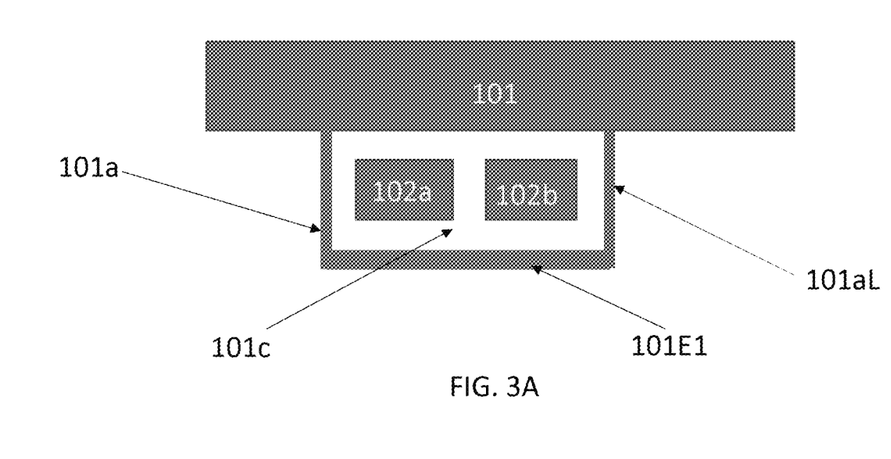
FIG. 3A illustrates a side view of an electrode structure of the electronic module in FIG. 1A according to one embodiment of the present invention.

In one embodiment, as shown in FIG. 3A, the first metal structure forms a first surface-mounted pad 101E1.

In one embodiment, the first metal structure forms a second surface-mounted pad.

In one embodiment, as shown in FIG. 3A, wherein a plurality of electrical components 102a, 102b are disposed in the first space 101c.

In one embodiment, as shown in FIG. 3A, the lateral surfaces 101aL of the first metal structure 101a comprises a closed metal path.

In one embodiment, the first metal structure 101a has a through opening on a lateral side of the first metal structure 101a.

In one embodiment, the lateral surfaces of the second metal structure 101b comprises a closed metal path.

In one embodiment, the second metal structure 101b has a through opening on a lateral side of the second metal structure 101b.

Figure 3B:
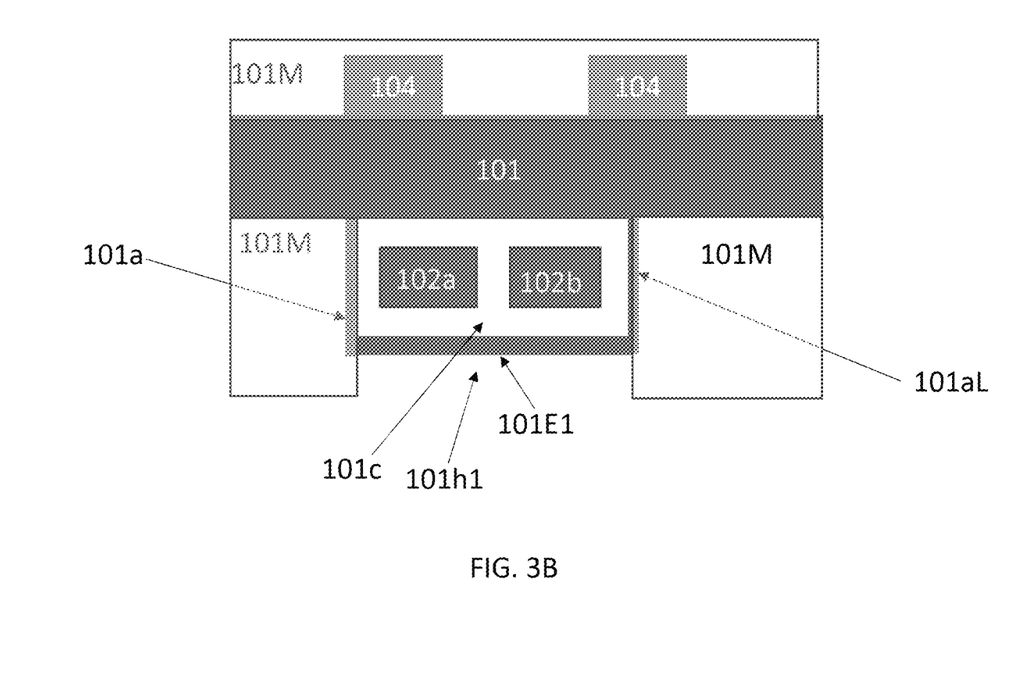
FIG. 3B illustrates a side view of a packaging structure according to one embodiment of the present invention.

In one embodiment, as shown in FIG. 3B, the molding body 101M encapsulates the electrical components disposed on the circuit board and the circuit board.

In one embodiment, as shown in FIG. 3B, the molding body 101M encapsulates the electrical components disposed on the circuit board, the circuit board, and a portion of the first metal structure.

The advantages of the present invention include: 1. reducing the design area of a circuit board and the cost of the circuit board; 2. reducing the thickness of the electronic module; 3. increasing the space available for the battery; 4. increasing the utilization space of the motherboard; 5. reducing the impact of the residual heat on the electrical components and the circuit board during spot-welding; 6. reducing the distance between the electrode and electrical components on the circuit board.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electronic module, comprising:
a circuit board;
a plurality of electrical components, disposed on a first surface of the circuit board and electrically connected to the circuit board;
a molding body, disposed on the first surface of the circuit board to encapsulate the plurality of electrical components, wherein a first recess is formed in the molding body; and
a first electrode, electrically coupled to the circuit board, wherein at least one portion of an electrode of an external component is disposed in the first recess and electrically connected to the first electrode of the electronic module, wherein the first electrode forms a partial portion of the entire bottom surface of the first recess.

2. The electronic module according to claim 1, wherein the external component is a battery, wherein at least one portion of an electrode of the battery is disposed in the first recess and electrically connected to the first electrode of the electronic module.

3. The electronic module according to claim 1, wherein a second recess is formed in the molding body, wherein the electronic module further comprises a second electrode electrically coupled to the circuit board.

4. The electronic module according to claim 3, wherein the second electrode forms a partial portion of the entire bottom surface of the second recess.

5. The electronic module according to claim 3, wherein the second electrode forms the entire bottom surface of the second recess.

6. The electronic module according to claim 3, wherein the external component is a battery, wherein at least one portion of a positive electrode of the battery is disposed in the first recess and electrically connected to the first electrode, and at least one portion of a negative electrode of the battery is disposed in the second recess and electrically connected to the second electrode.

7. The electronic module according to claim 1, wherein the electronic module comprises a first metal structure, wherein the first metal structure and the first surface of the circuit board form a first space therebetween, wherein at least one first electrical component is disposed in said first space, wherein an outer surface of the first metal structure forms the first electrode of the electronic module.

8. The electronic module according to claim 7, wherein the first metal structure has a U shape or an L shape.

9. The electronic module according to claim 7, wherein the first metal structure comprises copper.

10. The electronic module according to claim 7, wherein the first metal structure comprises a copper layer and a tin layer overlaid on the copper layer.

11. The electronic module according to claim 1, wherein the first surface of the circuit board is a bottom surface of the circuit board.

12. The electronic module according to claim 7, wherein the first metal structure is soldered to the circuit board.

13. The electronic module according to claim 7, wherein the at least one electrical component comprises at least one of the following: a resistor, a capacitor, and an inductor.

14. The electronic module according to claim 7, wherein the first metal structure comprises a copper layer, a nickel layer overlaid on the copper layer, and an aluminum layer overlaid on the nickel layer.

15. The electronic module according to claim 7, wherein the at least one electrical component comprises an active device and a passive device.

16. The electronic module according to claim 7, wherein said electronic module further comprises a second metal structure disposed on and electrically connected to the circuit board, wherein the second metal structure and a second surface of the circuit board form a second space therebetween, wherein at least one second electrical component is disposed in said second space and an outer surface of the second metal structure forms a second electrode for electrically connecting with said external component.

17. The electronic module according to claim 7, wherein lateral surfaces of the first metal structure comprise a closed metal path.

18. The electronic module according to claim 16, wherein lateral surfaces of the second metal structure comprise a closed metal path.

19. An electronic module, comprising:
a circuit board;
a plurality of electrical components, disposed on a first surface of the circuit board and electrically connected to the circuit board;
a molding body, disposed on the first surface of the circuit board to encapsulate the plurality of electrical components, wherein a first recess is formed in the molding body; and
a first electrode, electrically coupled to the circuit board, wherein at least one portion of an electrode of an external component is disposed in the first recess and electrically connected to the first electrode of the electronic module, wherein a second recess is formed in the molding body, wherein the electronic module further comprises a second electrode electrically coupled to the circuit board, wherein the second electrode forms a partial portion of the entire bottom surface of the second recess.

20. An electronic module, comprising:
a circuit board;
a plurality of electrical components, disposed on a first surface of the circuit board and electrically connected to the circuit board;
a molding body, disposed on the first surface of the circuit board to encapsulate the plurality of electrical components, wherein a first recess is formed in the molding body; and
a first electrode, electrically coupled to the circuit board, wherein at least one portion of an electrode of an external component is disposed in the first recess and electrically connected to the first electrode of the electronic module, wherein the electronic module comprises a first metal structure, wherein the first metal structure and the first surface of the circuit board form a first space therebetween, wherein at least one first electrical component is disposed in said first space, wherein an outer surface of the first metal structure forms the first electrode of the electronic module, wherein the at least one electrical component comprises at least one of the following: a resistor, a capacitor, and an inductor.

* * * * *